(12) United States Patent
Lu

(10) Patent No.: US 9,413,296 B2
(45) Date of Patent: Aug. 9, 2016

(54) AMPLIFIER WITH ENHANCED LINEARITY

(71) Applicant: QUALCOMM Incorporated, San Diego, CA (US)

(72) Inventor: Chao Lu, Fremont, CA (US)

(73) Assignee: Qualcomm Incorporated, San Diego, CA (US)

( * ) Notice: Subject to any disclaimer, the term of this patent is extended or adjusted under 35 U.S.C. 154(b) by 79 days.

(21) Appl. No.: 14/274,185

(22) Filed: May 9, 2014

(65) Prior Publication Data

US 2015/0288333 A1 Oct. 8, 2015

Related U.S. Application Data

(60) Provisional application No. 61/975,616, filed on Apr. 4, 2014.

(51) Int. Cl.

| H03F 1/30 | (2006.01) |
|---|---|
| H03F 1/02 | (2006.01) |
| H03F 3/21 | (2006.01) |
| H03F 1/22 | (2006.01) |
| H03F 1/32 | (2006.01) |
| H03F 3/24 | (2006.01) |
| H03F 3/30 | (2006.01) |
| H03F 3/72 | (2006.01) |

(52) U.S. Cl.
CPC .............. *H03F 1/0205* (2013.01); *H03F 1/223* (2013.01); *H03F 1/3205* (2013.01); *H03F 3/211* (2013.01); *H03F 3/245* (2013.01); *H03F 3/3022* (2013.01); *H03F 3/72* (2013.01); *H03F 2200/447* (2013.01); *H03F 2200/468* (2013.01); *H03F 2203/21106* (2013.01); *H03F 2203/7236* (2013.01)

(58) Field of Classification Search
CPC ........................................................ H03F 1/30
USPC .................................. 330/289, 285, 296, 311
See application file for complete search history.

(56) References Cited

U.S. PATENT DOCUMENTS 6,642,783 B2 * 11/2003 Constantinidis ...... H03F 1/3211
330/10
6,897,722 B2 5/2005 Cavers
(Continued)

FOREIGN PATENT DOCUMENTS

EP 1521360 A1 4/2005

OTHER PUBLICATIONS

Aparin V., et al., "Modified Derivative Superposition Method for Linearizing FET Low-Noise Amplifiers," IEEE Transactions on Microwave Theory and Techniques, IEEE Service Center, Piscataway, NJ, US, vol. 53, No. 2, Feb. 1, 2005, pp. 571-581, XP011126918 ISSN: 0018-9480.

(Continued)

*Primary Examiner* — Henry Choe
(74) *Attorney, Agent, or Firm* — Toler Law Group, PC

(57) ABSTRACT

An apparatus includes a first amplifier that includes a transistor that is coupled to an input terminal of the first amplifier. The transistor is biased to operate in a first mode based on a first operating point. The apparatus also includes a second amplifier coupled in parallel with the first amplifier. The second amplifier includes a second transistor coupled to an input terminal of the second amplifier. The second transistor is biased to operate in a second mode based on a second operating point that is temperature-dependent.

14 Claims, 8 Drawing Sheets

(56) References Cited

U.S. PATENT DOCUMENTS

| | | | |
|---|---|---|---|
| 7,061,315 B2 | 6/2006 | Merrill | |
| 7,375,588 B2 * | 5/2008 | Yamakawa | H03F 1/301 |
| | | | 330/289 |
| 7,656,227 B1 | 2/2010 | Beaudoin et al. | |
| 7,663,441 B2 | 2/2010 | Kang | |
| 8,149,050 B2 * | 4/2012 | Cabanillas | H03F 1/0277 |
| | | | 330/302 |
| 8,441,320 B2 * | 5/2013 | Signoff | H03F 1/30 |
| | | | 330/289 |
| 8,928,404 B2 * | 1/2015 | Khanifar | H03F 1/0288 |
| | | | 330/124 R |
| 2006/0159198 A1 | 7/2006 | Morimoto et al. | |
| 2009/0174481 A1 | 7/2009 | Chang | |
| 2013/0127528 A1 | 5/2013 | Choi et al. | |

OTHER PUBLICATIONS

International Search Report and Written Opinion—PCT/US2015/021845—ISA/EPO—Jul. 2, 2015, 13 pages.

Lu C., et al., "Linearization of CMOS Broadband Power Amplifiers Through Combined Multigated Transistors and Capacitance Compensation," IEEE Transactions on Microwave Theory and Techniques, Nov. 2007, vol. 55, No. 11, pp. 2320-2328.

* cited by examiner

AMPLIFIER WITH ENHANCED LINEARITY

I. CLAIM OF PRIORITY

The present application claims priority from U.S. Provisional Patent Application No. 61/975,616, filed Apr. 4, 2014, entitled "AMPLIFIER WITH ENHANCED LINEARITY," which is incorporated by reference in its entirety.

II. FIELD

The present disclosure is generally related to enhancing linearity of an amplifier.

III. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Wireless telephones may include amplifiers (e.g., driver amplifiers and power amplifiers) to amplify transmission signals (e.g., signals to be transmitted over a wireless network). Transmission signal quality (e.g., error vector magnitude (EVM)) and spectrum emission regulations (e.g., adjacent channel leakage ratio (ACLR)) may be affected by the linearity of the amplifiers. For example, an amplifier with relatively high linearity may achieve efficient EVM and ACLR. Amplifiers utilizing a multi-gated transistor (MGTR) topology (e.g., a superposition linearization technique) may achieve relatively high linearity; however, MGTR topologies are sensitive to temperature changes and process variations. As a result, performance (e.g., linearity) of MGTR topologies may be satisfactory under specific operating conditions (e.g., specific temperatures and/or process variations) and may significantly degrade when the specific operations conditions change.

IV. BRIEF DESCRIPTION OF THE DRAWINGS

V. DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
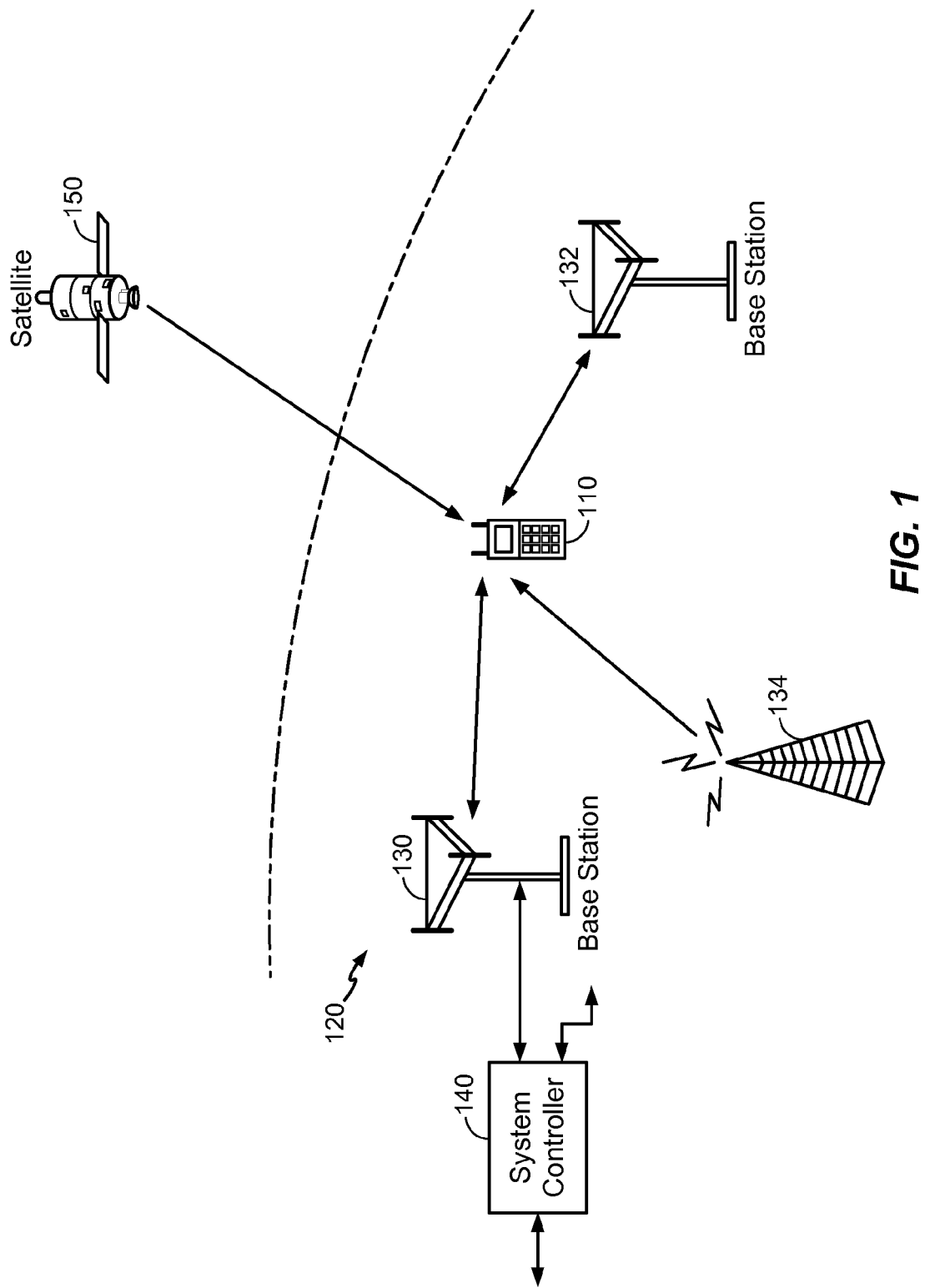
FIG. 1 shows a wireless device communicating with a wireless system.

FIG. 1 shows a wireless device 110 communicating with a wireless communication system 120. Wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Figure 2:
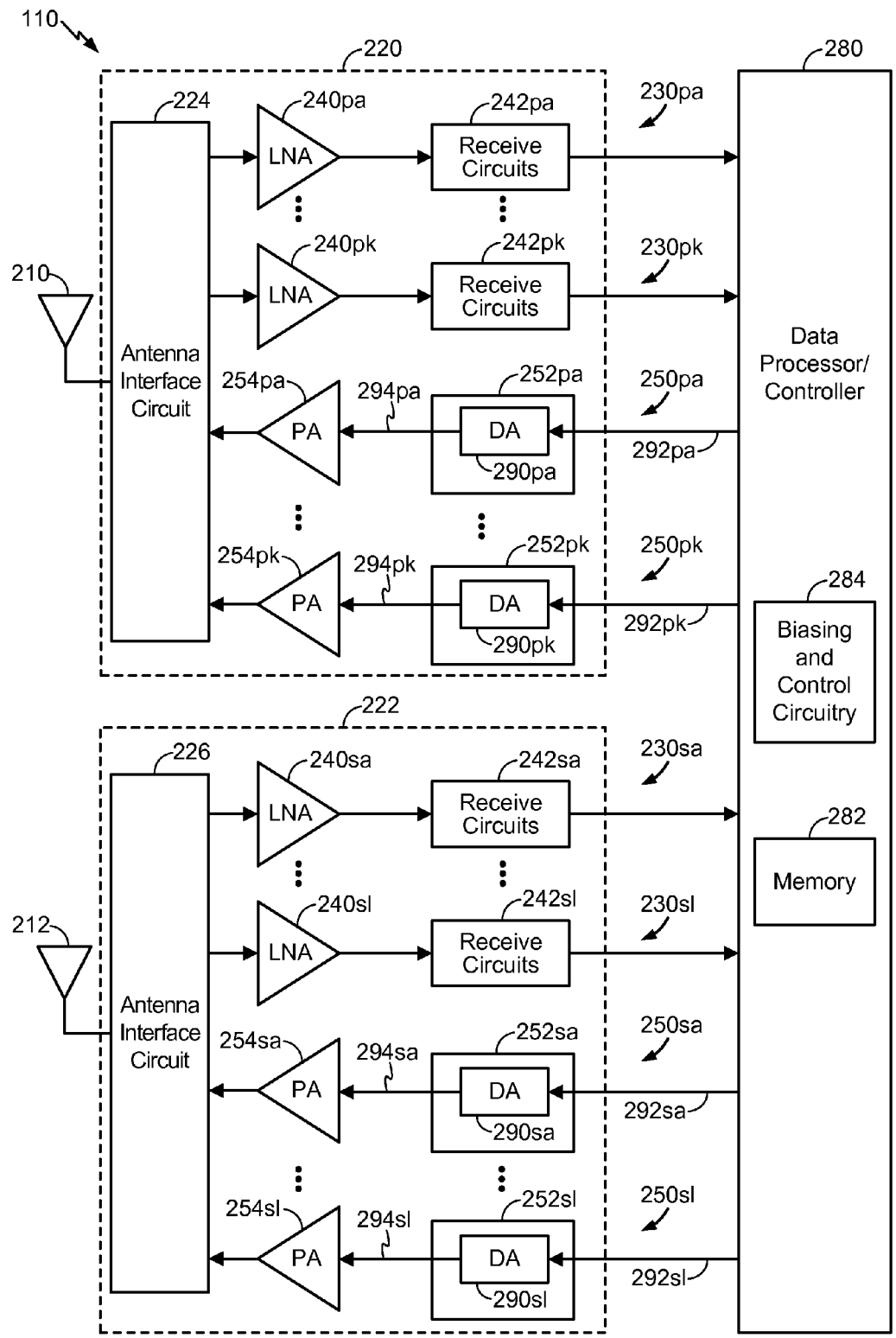
FIG. 2 shows a block diagram of the wireless device in FIG. 1.

FIG. 2 shows a block diagram of an exemplary design of wireless device 110 in FIG. 1. In this exemplary design, wireless device 110 includes a transceiver 220 coupled to a primary antenna 210, a transceiver 222 coupled to a secondary antenna 212, and a data processor/controller 280. Transceiver 220 includes multiple (K) receivers 230pa to 230pk and multiple (K) transmitters 250pa to 250pk to support multiple frequency bands, multiple radio technologies, carrier aggregation, etc. Transceiver 222 includes multiple (L) receivers 230sa to 230sl and multiple (L) transmitters 250sa to 250sl to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230pa, 230pk, 230sa, 230sl includes an LNA 240pa, 240pk, 240sa, 240sl and a receive circuit 242pa, 242pk, 242sa, 242sl, respectively. For data reception, antenna 210 receives signals from base stations and/or other transmitter stations and provides a received RF signal, which is routed through an antenna interface circuit 224 and presented as an input RF signal to a selected receiver. Antenna interface circuit 224 may include switches, duplexers, transmit filters, receive filters, matching circuits, etc. The description below assumes that receiver 230pa is the selected receiver. Within receiver 230pa, an LNA 240pa amplifies the input RF signal and provides an output RF signal. Receive circuits 242pa downconvert the output RF signal from RF to baseband, amplify and filter the downconverted signal, and provide an analog input signal to data processor 280. Receive circuits 242pa may include mixers, filters, amplifiers, matching circuits, an oscillator, a local oscillator (LO) generator, a phase locked loop (PLL), etc. Each remaining receiver 230 in transceivers 220 and 222 may operate in similar manner as receiver 230pa.

In the exemplary design shown in FIG. 2, each transmitter 250pa, 250pk, 250sa, 250sl includes a transmit circuit 252pa, 252pk, 252sa, 252sl and a power amplifier (PA) 254pa, 254pk, 254sa, 254sl, respectively. For data transmission, data processor 280 processes (e.g., encodes and modulates) data to be transmitted and provides an analog output signal to a selected transmitter. The description below assumes that transmitter 250pa is the selected transmitter. Within transmitter 250pa, transmit circuits 252pa amplify, filter, and upconvert the analog output signal from baseband to RF and provide a modulated RF signal. Transmit circuits 252pa may include amplifiers, filters, mixers, matching circuits, an oscillator, an LO generator, a PLL, etc. A PA 254pa receives and amplifies the modulated RF signal and provides a transmit RF signal having the proper output power level. The transmit RF signal is routed through antenna interface circuit 224 and transmitted via antenna 210. Each remaining transmitter 250 in transceivers 220 and 222 may operate in similar manner as transmitter 250pa.

FIG. 2 shows an exemplary design of receiver 230 and transmitter 250. A receiver and a transmitter may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 may be implemented on one module, which may be an RFIC, etc. The circuits in transceivers 220 and 222 may also be implemented in other manners.

In an exemplary embodiment, the transmit circuits 252pa, 252pk, 252sa, 252sl may include driver amplifiers 290pa, 290pk, 290sa, 290sl, respectively. The driver amplifiers 290pa, 290pk, 290sa, 290sl may receive transmission signals (e.g., input signals) from the controller 280. Each driver amplifier 290pa, 290pk, 290sa, 290sl may include a first amplifier and a second amplifier coupled in parallel with the first amplifier. The first amplifier may include a first transistor and the second amplifier may include a second transistor. The first transistor may be biased to operate in a first mode based on a first voltage signal, and the second transistor may be biased to operate in a second mode based on a second voltage signal, as described in greater detail with respect to FIGS. 3-8.

In an exemplary embodiment, the power amplifiers 254pa, 254pk, 254sa, 254sl may receive output signals from the driver amplifiers 290pa, 290pk, 290sa, 290sl, respectively. One or more of the power amplifiers 254pa, 254pk, 254sa, 254sl and/or one or more of the driver amplifiers 290pa, 290pk, 290sa, 290sl may include a first amplifier (e.g., the first amplifier 306 of FIG. 3) and a second amplifier (e.g., the second amplifier 308 of FIG. 3) coupled in parallel with the first amplifier. The first amplifier may include a first transistor (e.g., the first transistor 316 of FIG. 3) and the second amplifier may include a second transistor (e.g., the second transistor 326 of FIG. 3). The first transistor may be biased to operate in a first mode based on a first voltage signal (e.g., a first operating point), and the second transistor may be biased to operate in a second mode based on a second voltage signal (e.g., a second operating point), as described in greater detail with respect to FIGS. 3-8. For example, the amplification circuitry 302 of FIG. 3 may correspond to one or more of the power amplifiers 254pa, 254pk, 254sa, 254sl and/or one or more of the driver amplifiers 290pa, 290pk, 290sa, 290sl.

Data processor/controller 280 may perform various functions for wireless device 110. For example, data processor 280 may perform processing for data being received via receivers 230 and data being transmitted via transmitters 250. Controller 280 may control the operation of the various circuits within transceivers 220 and 222. For example, the controller 280 may include biasing and control circuitry 284 (e.g., the biasing and control circuitry 304 of FIG. 3) to bias the first transistor and the second transistor to operate in the first mode or the second mode, respectively. A memory 282 may store program codes and data for data processor/controller 280. Data processor/controller 280 may be implemented on one or more application specific integrated circuits (ASICs) and/or other ICs.

Wireless device 110 may support multiple band groups, multiple radio technologies, and/or multiple antennas. Wireless device 110 may include a number of LNAs to support reception via the multiple band groups, multiple radio technologies, and/or multiple antennas.

Figure 3:
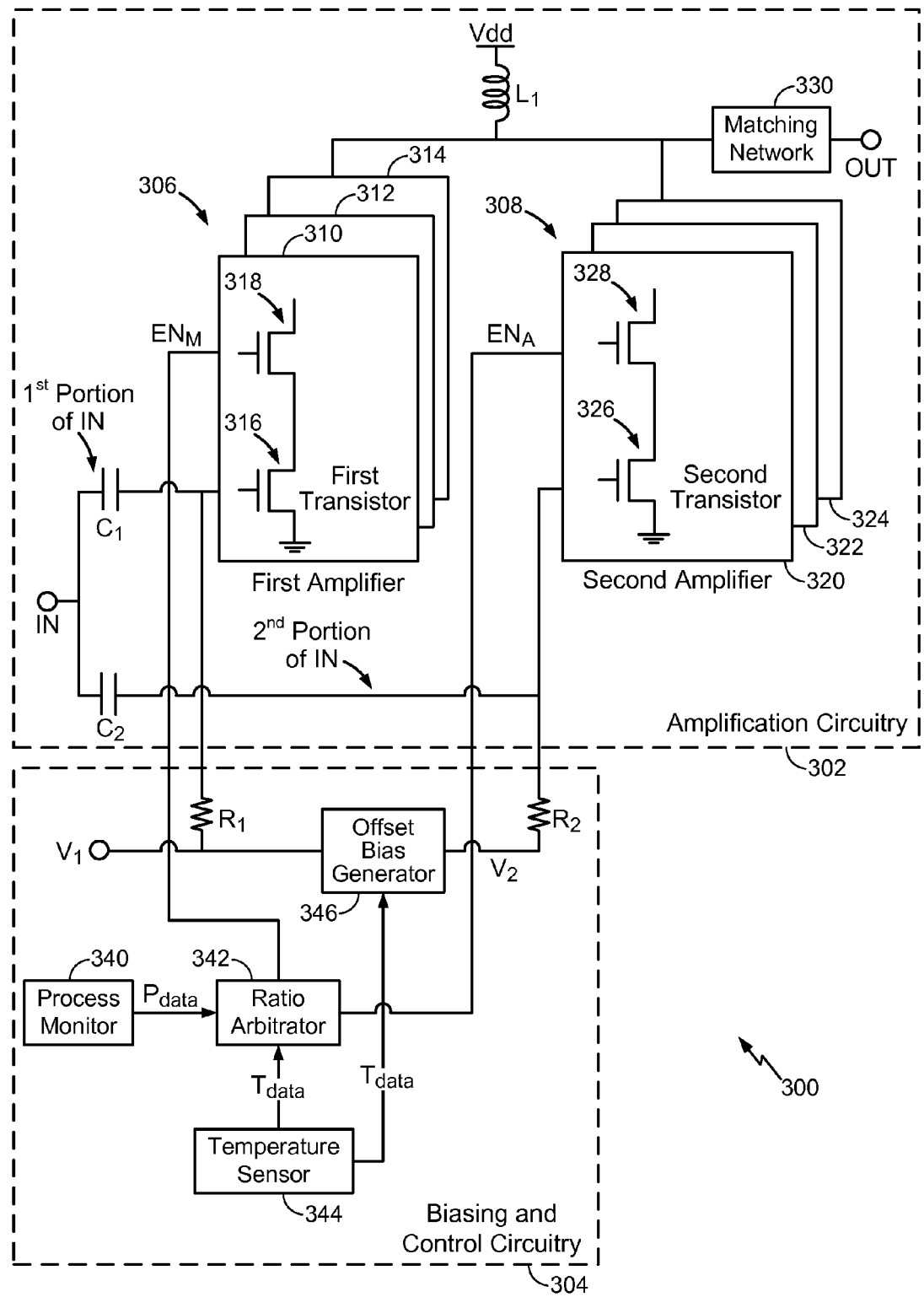
FIG. 3 is a diagram that depicts an exemplary embodiment of a system that is operable to enhance linearity of an amplifier.

Referring to FIG. 3, a diagram of a system 300 that is operable to enhance linearity of an amplifier is shown. The system 300 includes amplification circuitry 302 and biasing and control circuitry 304. In an exemplary embodiment, the amplification circuitry 302 may be included in a power amplifier or a driver amplifier. For example, the amplification circuitry 302 may be one or more of the power amplifiers 254pa, 254pk, 254sa, 254sl of FIG. 2. In addition, or alternatively, the amplification circuitry 302 may be one or more of the driver amplifiers 290pa, 290pk, 290sa, 290sl of FIG. 2. The biasing and control circuitry 304 may be included on a "chip" associated with the transceivers 220, 222 of FIG. 2 and/or may be included in the controller 280 of FIG. 2.

The amplification circuitry 302 includes a first amplifier 306 and a second amplifier 308 coupled in parallel with the first amplifier 306. The first amplifier 306 may include multiple branches (e.g., unit cells). For example, the first amplifier 306 may include a first branch 310, a second branch 312, and an $N^{th}$ branch 314. In an exemplary embodiment, N is any integer greater than zero. For example, if N is equal to two, the first amplifier 306 would include two branches. In a similar manner, the second amplifier 308 may include multiple branches. For example, the second amplifier 308 may include a first branch 320, a second branch 322, and a $K^{th}$ branch 324. In an exemplary embodiment, K is any integer greater than zero. For example, if K is equal to seven, the second amplifier 308 would include seven branches.

The first branch 310 may include a first transistor 316 and a first switch 318 (e.g., a pair of cascoded transistors). In an exemplary embodiment, the first transistor 316 and the first switch 318 are n-type metal oxide semiconductor (NMOS) transistors. A source of the first transistor 316 may be coupled to ground, and a drain of the first transistor 316 may be coupled to a source of the first switch 318. A drain of the first switch 318 may be coupled to a supply voltage (Vdd) via a first inductor ($L_1$). A gate of the first transistor 316 may be coupled to receive a first portion of an input signal (IN) via a first capacitor ($C_1$). In an exemplary embodiment, the input signal (IN) is a transmission signal (e.g., a voltage signal). For example, the input signal (IN) may be the transmission signal 292$pa$, 292$pk$, 292$sa$, 292$sl$ provided to the driver amplifiers 290$pa$, 290$pk$, 290$sa$, 290$sl$ of FIG. 2, the output signal 294$pa$, 294$pk$, 294$sa$, 294$sl$ of the driver amplifiers 290$pa$, 290$pk$, 290$sa$, 290$sl$ provided to the power amplifiers 254$pa$, 254$pk$, 254$sa$, 254$sl$ of FIG. 2, or any combination thereof. As explained below, the gate of the first transistor 316 may also be biased based on a first voltage signal ($V_1$). A gate of the first switch 318 may be coupled to receive a first control signal ($EN_M$). In an exemplary embodiment, the first control signal ($EN_M$) is a multi-bit digital code that selectively causes the first switch 318 to conduct (e.g., selectively activates the first branch 310), as explained in further detail with respect to FIG. 5.

Each branch 312-314 may be coupled in parallel and may have a substantially similar configuration as the first branch 310. For example, the second branch 312 and the $N^{th}$ branch 314 may include a second transistor (not shown) and an $N^{th}$ transistor (not shown), respectively. The second branch 312 and the $N^{th}$ branch 314 may also include a second switch (not shown) and an $N^{th}$ switch (not shown), respectively. The gates of the second transistor and the $N^{th}$ transistor may be coupled to receive the first portion of the input signal (IN), and the gates of the second switch and the $N^{th}$ switch may be coupled to receive the first control signal ($EN_M$). In an exemplary embodiment, each switch of the first amplifier 306 may be coupled to receive voltage signals that correspond to different bits of the first control signal ($EN_M$) so that the first control signal ($EN_M$) may selectively activate particular branches 310-314 and selectively deactivate other branches 310-314. For example, the first switch 318 may be coupled to receive a first voltage signal corresponding to a first bit of the first control signal ($EN_M$), the second switch may be coupled to receive a second voltage signal corresponding to a second bit of the first control signal ($EN_M$), etc.

The first branch 320 may include a second transistor 326 and a first switch 328 (e.g., a pair of cascoded transistors). In an exemplary embodiment, the second transistor 326 and the first switch 328 are NMOS transistors. A source of the second transistor 326 may be coupled to ground, and a drain of the second transistor 326 may be coupled to a source of the first switch 328. A drain of the first switch 328 may be coupled to the supply voltage (Vdd) via the first inductor ($L_1$). A gate of the second transistor 326 may be coupled to receive a second portion of the input signal (IN) via a second capacitor ($C_2$). As explained below, the gate of the second transistor 326 may also be biased based on a second voltage signal ($V_2$) (e.g., a temperature-dependent voltage signal). A gate of the first switch 318 may be coupled to receive a second control signal ($EN_A$). In an exemplary embodiment, the second control signal ($EN_A$) is a multi-bit digital code that selectively causes the first switch 328 to conduct (e.g., selectively activates the first branch 320).

Each branch 322-324 may be coupled in parallel and may have a substantially similar configuration as the first branch 320. For example, the second branch 322 and the $K^{th}$ branch 324 may include a transistor (not shown) and a $K^{th}$ transistor (not shown), respectively. The second branch 322 and the $K^{th}$ branch 324 may also include a second switch (not shown) and a $K^{th}$ switch (not shown), respectively. The gates of the second transistor and the $K^{th}$ transistor may be coupled to receive the second portion of the input signal (IN), and the gates of the second switch and the $K^{th}$ switch may be coupled to receive the second control signal ($EN_A$). In an exemplary embodiment, each switch of the second amplifier 308 may be coupled to receive voltage signals that correspond to different bits of the second control signal ($EN_A$) such that the second control signal ($EN_A$) may selectively activate particular branches 320-324 and selectively deactivate other branches 320-324.

The biasing and control circuitry 304 includes a process monitor 340, a ratio arbitrator 342, a temperature sensor 344, and an offset bias generator 346. In a first exemplary embodiment, the process monitor 340 may include circuitry to monitor process variations of the system 300. For example, the process monitor 340 may dynamically monitor (e.g., monitor "on the fly") characteristics (e.g., process speeds) of the system 300 to determine a process corner of the system 300 (e.g., process variations of a transceiver chip). The process corner may be provided to the ratio arbitrator 342 as process data ($P_{data}$). For example, the process data ($P_{data}$) may indicate whether the process corner of the system 300 is fast-fast (FF, corresponding to fast process, typical-typical (TT, corresponding to typical process), slow-slow (SS, corresponding to slow process), or some relative information normalized to a known reference process corner.

Figure 9:
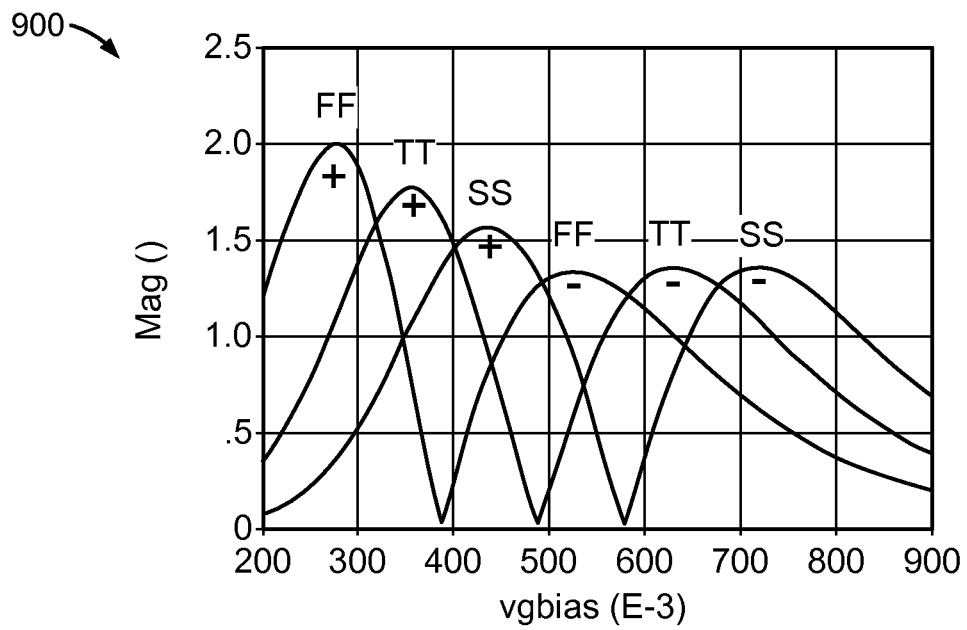
FIG. 9 shows diagrams of third-order derivative transistor I-V curves.
Figure 9:
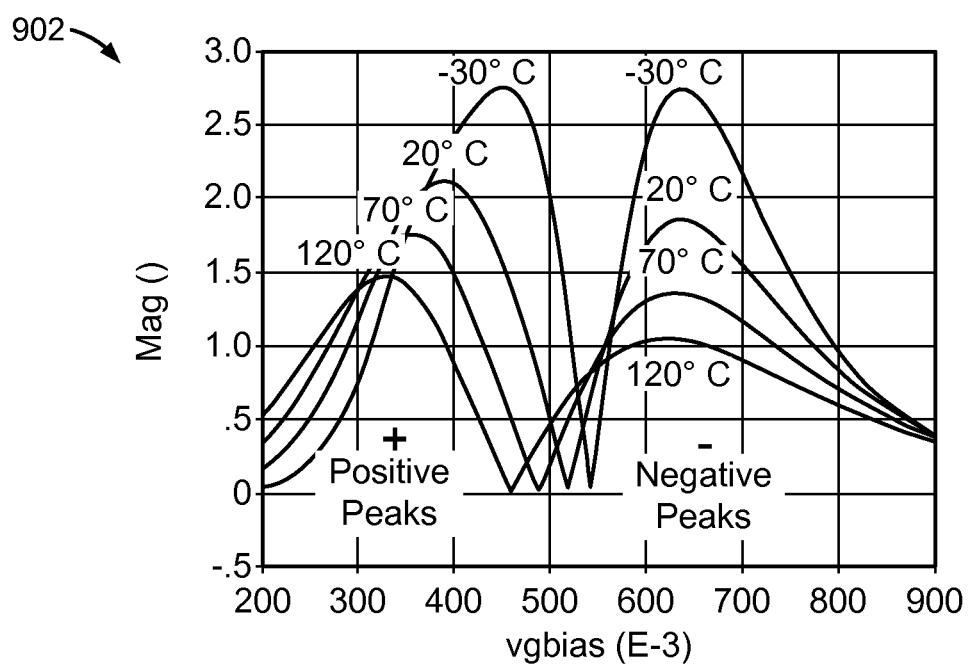

Referring to FIG. 9, an illustrative embodiment of a third-order derivative of a transistor I-V curve 900 is shown. Each trace on the curve 900 illustrates the positive peaks and negative peaks of the third-order derivative for a transistor (e.g., a transistor in the first amplifier 306 or a transistor in the second amplifier 308) for different process corners. As explained below, the non-zero peak values may affect linearity of the amplification circuitry 302. MGTR scheme nulls out the negative peak of one transistor through the positive peak of an offset biased auxiliary transistor for linearity improvement. A first trace illustrates positive peaks (+) and negative peaks (−) for a FF process corner, a second trace illustrates positive peaks and negative peaks for a TT process corner, and a third trace illustrates positive peaks and negative peaks for a SS process corner. The relative peak value of the positive and negative peaks may vary over process corners. This leads to process dependent performance variation of the amplifiers. The performance degradation can be mitigated through the ratio adjustment between main and auxiliary path utilizing the biasing and control circuitry 304.

In a second exemplary embodiment, the process monitor 340 may provide a fixed value for the process data. For example, the process corner of the system 300 may be determined during manufacturing of the system 300. In the second exemplary embodiment, the process monitor 340 may be implemented as a one-time programmable cell (or as a fuse). For example, the voltage across the one-time programmable cell may be provided to the ratio arbitrator 342 as the process data ($P_{data}$) to indicate the process corner of the system 300.

The temperature sensor 344 may be configured to measure the temperature of the system 300. For example, the temperature sensor 344 may include a temperature-dependent sensing element, such as a thermistor (e.g., a resistor that has a resistance that varies with temperature), to generate temperature measurements of the system 300. The temperature measurements may be provided to the ratio arbitrator 342 and to the offset bias generator 346 as temperature data ($T_{data}$).

Referring to FIG. 9, an illustrative embodiment of a third-order derivative of a transistor I-V curve 902 is shown. Each trace on the curve 902 illustrates the positive peaks (+) and negative peaks (−) of the third-order derivative for a transistor (e.g., a transistor in the first amplifier 306 or a transistor in the second amplifier 308) for different temperatures. As explained below, the peak values may affect linearity of the amplification circuitry 302. A first trace illustrates positive peaks and negative peaks for a temperature of −30° Celsius, a second trace illustrates positive peaks and negative peaks for a temperature of 20° Celsius, a third trace illustrates positive peaks and negative peaks for a temperature of 70° Celsius, and a fourth trace illustrates positive peaks and negative peaks for a temperature of 120° Celsius. The voltage offset between a transistor positive peak and a negative peak may be a function of temperature. In addition, the relative peak value of the positive and negative peaks may vary over different temperatures. These effects can be alleviated through a temperature dependent biasing scheme and ratio adjustment.

Linearity of the amplification circuitry 302 may be compromised due to process variations and temperature variations. The ratio arbitrator 342 may control a ratio of active branches 310-314 to active branches 320-324 based on the process data ($P_{data}$) and the temperature data ($T_{data}$) to enhance linearity of the amplification circuitry 302. In an exemplary embodiment, the ratio arbitrator 342 may be implemented as a lookup table. For example, based on the process corner indicated by the process data ($P_{data}$) and the temperature indicated by the temperature data ($T_{data}$), the ratio arbitrator 342 may be configured to control the ratio of active branches 310-314 to active branches 320-324. In another exemplary embodiment, the ratio arbitrator 342 may be implemented as one or more processing elements configured to determine the ratio by inserting the process data ($P_{data}$) and the temperature data ($T_{data}$) into one or more empirical equations.

The ratio arbitrator 342 is configured to generate the first control signal ($EN_M$) to selectively activate branches 310-314, and the ratio arbitrator 342 is configured to generate the second control signal ($EN_A$) to selectively activate branches 320-324. For example, each bit of the first control signal ($EN_M$) (e.g., a multi-bit digital code) may be provided to a switch of a corresponding branch of the branches 310-314. To illustrate, a first bit of the first control signal ($EN_M$) may be provided to the gate of the first switch 318 of the first branch 310, a second bit of the first control signal ($EN_M$) may be provided to the gate of the second switch of the second branch 312, etc. The first bit of the first control signal ($EN_M$) may selectively activate the first branch 310 (e.g., enable current from the supply voltage (Vdd) to ground via the first branch 310). For example, a logical high voltage signal may activate the first switch 318 (e.g., enable conduction) when the first bit of the first control signal ($EN_M$) has a logical "1" value, and a logical low voltage signal may deactivate the first switch 318 (e.g., disable conduction) when the first bit of the first control signal ($EN_M$) has a logical "0" value.

In a substantially similar manner, each bit of the second control signal ($EN_A$) may be provided to a switch in a corresponding branch of the branches 320-324. To illustrate, a first bit of the second control signal ($EN_A$) may be provided to the gate of the first switch 328 of the first branch 320, a second bit of the second control signal ($EN_A$) may be provided to the gate of the second switch of the second branch 322, etc. The first bit of the second control signal ($EN_A$) may selectively activate the first branch 320. For example, a logical high voltage signal may activate the first switch 328 when the first bit of the second control signal ($EN_A$) has a logical "1" value, and a logical low voltage signal may deactivate the first switch 328 when the first bit of the first control signal ($EN_A$) has a logical "0" value.

By selectively activating the branches 310-314 and the branches 320-324, an amount of current provided to the matching network 330 may be adjusted to compensate for process variations and temperature variations. Adjusting the amount of current provided by the branches 310-314 and the branches 320-324, respectively, may lead to cancellation of nonlinear current to the matching network 330, which in turn, may adjust (e.g., enhance) linearity and reduce degradation of the input signal (IN) during amplification. For example, the nonlinear components of an output current generated by the branches 310-314 can be nulled out when activating a proper number of unit cells in the branches 320-324 with an appropriate offset bias voltage.

Adjusting the amount of current provided to the matching network 330 (e.g., a load including inductors, capacitors, etc.) may adjust the nonlinear components of the output signal (OUT). High linearity (e.g., increasing the power level of the input signal (IN) with relatively small degradation) may be achieved by adjusting the amount of current provided to the matching network 330 so that the output signal (OUT) corresponds to an amplified version of the input signal (IN) with relatively small degradation (e.g., content alteration). The adjustment may be made based on process and temperature information to maintain the superior linearity of the output signal (OUT), so is the offset bias voltage.

The first transistor 316 may be biased to operate in a first mode based on the first voltage signal ($V_1$). For example, the gate of the first transistor 316 may be biased at the first voltage signal ($V_1$) through a first resistor ($R_1$). The first mode may correspond to a saturation mode (e.g., a strong-inversion mode) of operation. For example, the voltage applied to the gate of the first transistor 316 may exceed the threshold voltage of the first transistor 316 (e.g., the gate-to-source voltage is greater than the threshold voltage). Biasing the first transistor 316 to operate in the first mode may adjust an amount of current flowing through the first branch 310, which as described above, may adjust linearity and degradation.

As explained below, the offset bias generator 346 may be configured to generate the second voltage signal ($V_2$) (e.g., a temperature-dependent voltage signal) and bias the transistors in the branches 320-324 based on the second voltage signal ($V_2$). For example, the offset bias generator 346 may be configured to control a voltage offset (e.g., a voltage difference between the first voltage signal ($V_1$) and the second voltage signal ($V_2$)) based on the temperature data ($T_{data}$).

Figure 4:
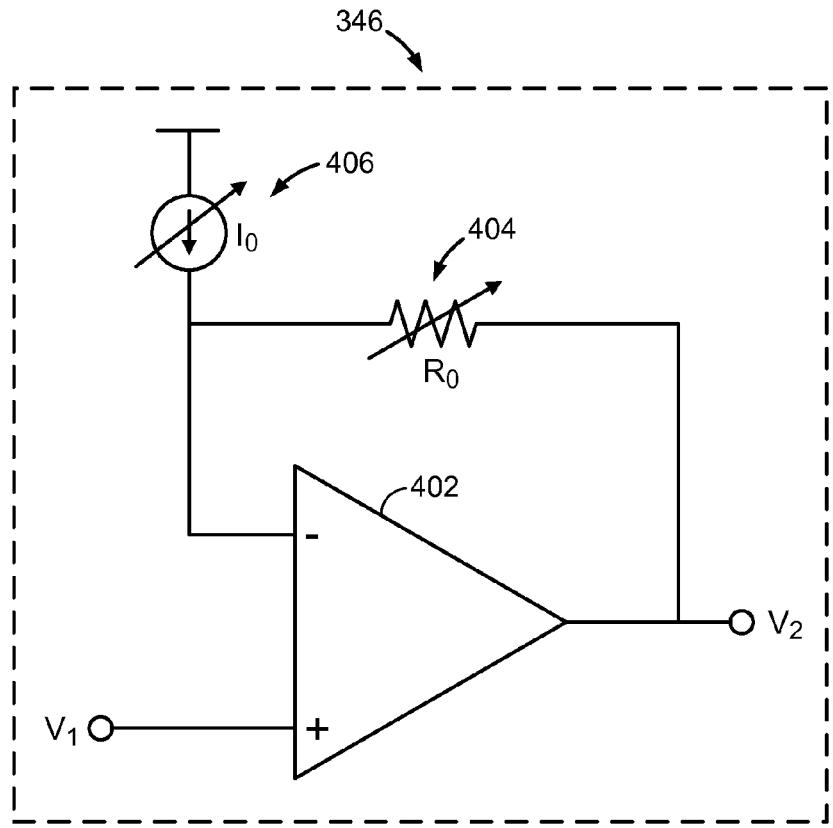
FIG. 4 is a diagram that depicts an exemplary embodiment of an offset bias generator of the system of FIG. 3.
Figure 4:
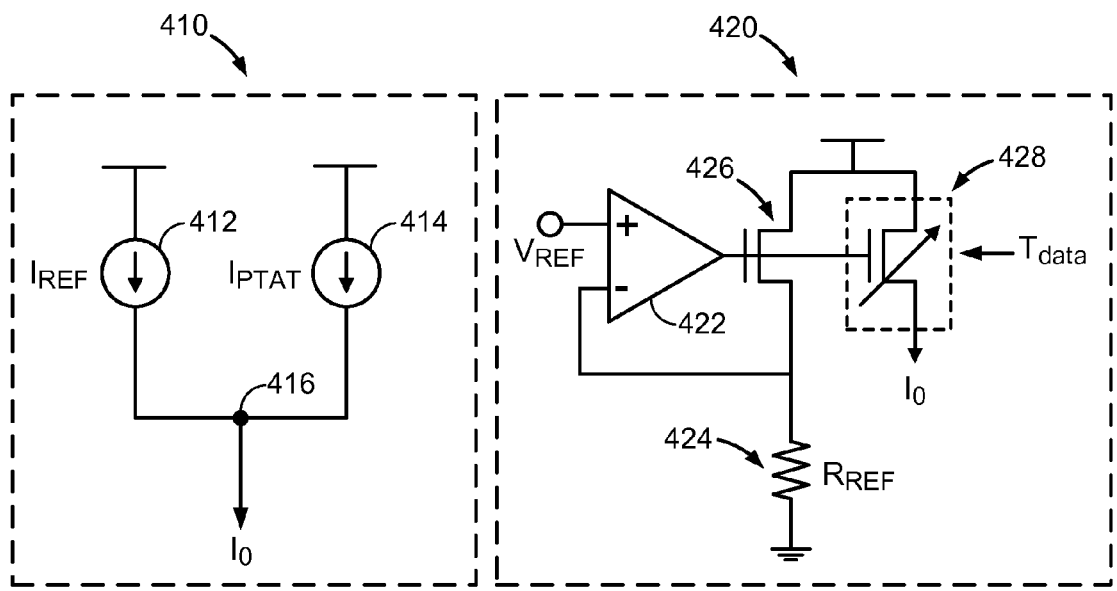

Referring to FIG. 4, an exemplary embodiment of the offset bias generator 346 is shown. The offset bias generator 346 may include an operational amplifier 402, a temperature-dependent resistor 404 (e.g., a thermistor), and a temperature-dependent current source 406. The temperature-dependent resistor 404 may have a resistance ($R_0$) that varies with temperature, and the temperature-dependent current source 406 generates a current ($I_0$) that varies with temperature.

The first voltage signal ($V_1$) may be provided to a positive input terminal of the operational amplifier 402. The operational amplifier 402 may be configured to generate the second voltage signal ($V_2$) based on a feedback path associated with temperature-dependent resistor 404 and the temperature-dependent current source 406. For example, the temperature-dependent resistor 404 may be coupled to an output of the operational amplifier 402 and to a negative input terminal of the operational amplifier 402. The temperature-dependent current source 406 may be coupled to provide the current ($I_0$) through the temperature-dependent resistor 404. The output of the operational amplifier 402 may be coupled to provide the second voltage signal ($V_2$) such that the second voltage ($V_2$) is approximately equal to the first voltage of the first voltage signal ($V_1$) minus the product of the resistance ($R_0$) and the current ($I_0$) (e.g., $V_2=V_1-I_0*R_0$).

A first embodiment 410 of the temperature-dependent current source 406 includes a reference current source 412 and a proportional to absolute temperature (PTAT) current source 414. The reference current source 412 may be configured to generate a reference current ($I_{REF}$) (e.g., a substantially constant current) and provide the reference current ($I_{REF}$) to a summing node 416. The PTAT current source 414 may be configured to generate a PTAT current ($I_{PTAT}$) (e.g., a current that varies with temperature) and provide the PTAT current ($I_{PTAT}$) to the summing node 416. The current mixer 416 may combine the reference current ($I_{REF}$) with the PTAT current ($I_{PTAT}$) to generate the current ($I_0$).

A second embodiment 420 of the temperature-dependent current source 406 includes an operational amplifier 422, a reference resistor 424, a first transistor 426, and an array of transistors 428. A reference voltage ($V_{REF}$) may be provided to a positive input terminal of the operational amplifier 422. A first terminal of the reference resistor 424 may be coupled to ground, and a second terminal of the reference resistor 424 may be coupled to a negative input terminal of the operational amplifier 422. A gate of the first transistor 426 may be coupled to an output of the operational amplifier 422, and a drain of the first transistor 426 may be coupled to the second terminal of the reference resistor 424. A source of the first transistor 426 may be coupled to a supply voltage.

The array of transistors 428 may include multiple transistors that are selectively enabled based on the temperature data ($T_{data}$) to vary the amount of current ($I_0$). For example, the temperature data ($T_{data}$) may a multi-bit digital code configured to selectively activate transistors in the array of transistors 428 (e.g., increase the current ($I_0$)) and selectively deactivate transistors in the array of transistors 428 (e.g., decrease the current ($I_0$)). Thus, the current ($I_0$) may be digitally controlled such that a number of active branches (e.g., transistors in the array of transistors 428) are programmed based on the temperature data ($T_{data}$).

Referring back to FIG. 3, the second transistor 326 may be biased to operate in a second mode based on the second voltage signal ($V_2$). For example, the gate of the second transistor 326 may be biased by the sum of the second voltage of the second voltage signal ($V_2$) and a voltage across a second resistor ($R_2$). The second mode may correspond to a weak-inversion mode or a triode mode of operation. For example, the voltage applied to the gate of the second transistor 326 may be such that the gate voltage of the second transistor 326 is close to or less than the threshold voltage of the second transistor 326 (e.g., the gate-to-source voltage is less than the threshold voltage). Biasing the second transistor 326 to operate in the second mode may adjust an amount of current flowing through first branch 320, which as described above, may adjust linearity and degradation.

For simplicity of illustration, one second amplifier 308 is depicted in FIG. 3. However, the techniques described above may be extended such that additional auxiliary amplifiers may be added to the amplification circuitry 302. For example, additional auxiliary amplifiers may be coupled in parallel to the first amplifier 306 and the second amplifier 308. To illustrate, an auxiliary amplifier (not shown) including one or more branches may include transistors that are biased to operate in a third mode based on a third voltage signal. A voltage of the third voltage signal may be smaller than the second voltage of the second voltage signal ($V_2$) such that the third mode corresponds to an inversion mode having a smaller conduction (e.g., source-to-drain current) than the second mode. Each branch of the auxiliary amplifier may be selectively activated via control signals based on the process data ($P_{data}$) and the temperature data ($T_{data}$) to adjust an amount of current propagating through the auxiliary amplifier. Additional auxiliary amplifiers may enable "wider" linearity tuning range. For example, the amount of linear current provided to the matching network 330 may be higher based on auxiliary amplifiers configured to provide additional linearity enhancement (e.g., based on transistors in auxiliary amplifiers operating in decreased conductance inversion modes), thereby the linear output power level can be improved.

In another exemplary embodiment, a balloon amplifier (not shown) may be coupled to receive output signals (e.g., voltages) from the first amplifier 306 and the second amplifier 308. The balloon amplifier may be configured to combine the output signals and provide the combined output signals to the matching network 330.

Although the system 300 is described with respect to a single-ended topology, the application of the techniques described above may also be extended to differential topologies. For example, the system 300 may include two first amplifiers and two second amplifiers. In this case, the ratio arbitrator 342 may generate a pair of control signals ($EN_M$) for the first amplifiers and a pair of control signal ($EN_A$) for the second amplifiers. Additionally, the offset bias generator 346 may bias transistors of the second amplifiers based on the second voltage signal ($V_2$).

The system 300 of FIG. 3 may enhance linearity and reduce degradation of the input signal (IN) during amplification for multi-gated transistor amplification systems. Enhancing linearity may also improve an adjacent channel leakage ratio (ACLR) (e.g., the ratio of the mean power centered on an adjacent channel frequency compared to the mean power centered on the channel frequency associated with the amplification circuitry 302). In a particular embodiment, based on temperature-dependent voltage biasing via the offset bias generator 346, ACLR may be improved approximately between 3.5 decibels (dBs) and 8 dBs for a Long Term Evolution (LTE) 20 megahertz (MHz) signal across an operational temperature range (e.g., between −30 degrees Celsius and 120 degrees Celsius). Equivalently, power consumption may be reduced by more than 20 percent based on the invented temperature dependent biasing scheme. Additional ACLR improvement and power consumption savings may be realized by adjusting the ratio of active branches 310-314 to active branches 320-324 (e.g., adjusting the transistor size ratio).

Figure 5:
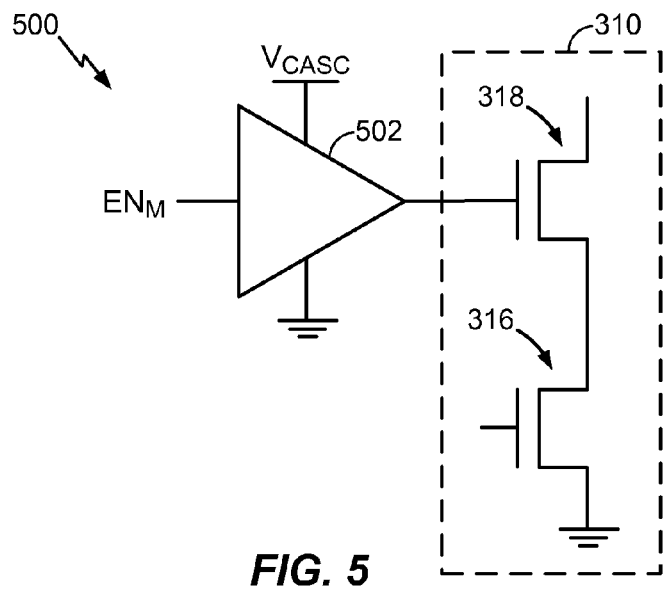
FIG. 5 is a diagram that depicts an exemplary embodiment of a circuit that can be configured as one unit cell of FIG. 3, and the unit cell can be selectively activated based on process variations and temperature variation.

Referring to FIG. 5, an exemplary embodiment of a circuit 500 that is configured to selectively activate the first branch 310 based on process variations and temperature variation is shown. The circuit 500 may include the first transistor 316 of the first branch 310 and the first switch 318 of the first branch 310.

A first bit of the first control signal ($EN_M$) may be provided to a buffer 502. Based on a bit value of the first bit of the first control signal ($EN_M$), the buffer 502 may provide a logical high voltage signal (e.g., a cascoded voltage signal ($V_{CASC}$)) to the gate of the first switch 318 or a logical low voltage signal (e.g., a ground voltage) to the gate of the first switch 318. For example, the buffer 502 may provide the cascoded voltage signal ($V_{CASC}$) to the gate of the first switch 318 when the bit value of the first bit is a logical "1." Based on the cascoded voltage signal ($V_{CASC}$), the first switch 318 may conduct (e.g., current may flow from source to drain) and the first branch 310 may be activated. Alternatively, the buffer 502 may provide the ground voltage to the gate of the first switch 318 when the bit value of the first bit is a logical "0." Based on the ground voltage, conduction by the first switch 318 may be disabled and the first branch 310 may be deactivated. In a similar manner, a second bit of the first control signal ($EN_M$) may be provided to a buffer (not shown) to selectively activate the second branch 312 of FIG. 3.

Although the circuit 500 of FIG. 5 depicts components of the first branch 310, a similar topology may be used to selectively activate other branches of the first amplifier 306 and branches of the second amplifier 308.

Figure 6:
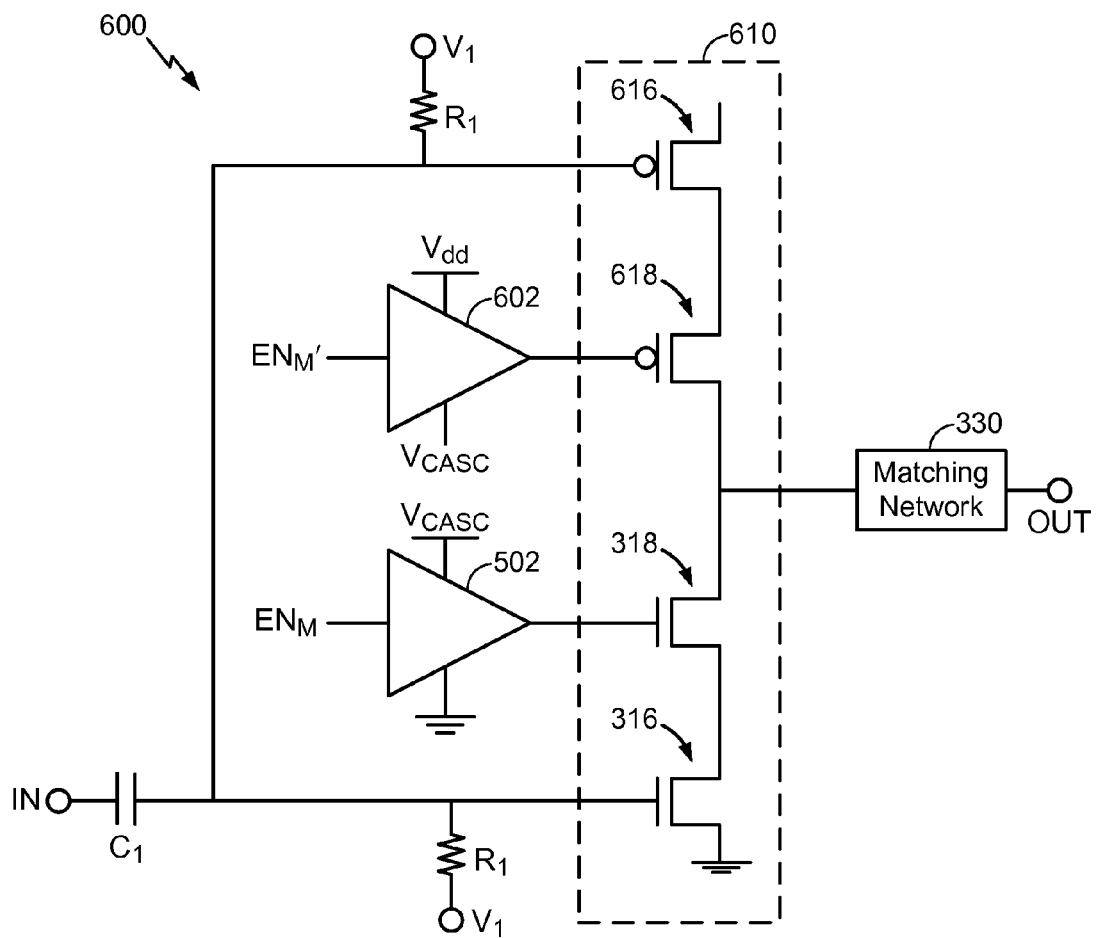
FIG. 6 is a diagram that depicts an exemplary embodiment of a circuit configured to selectively activate either a first branch or a second branch based on process variations and temperature variation.

Referring to FIG. 6, an exemplary embodiment of a circuit 600 that is configured to selectively activate a branch 610 based on process variations and temperature variation is shown. In an exemplary embodiment, the branch 610 may be alternate embodiment of the first branch 310 of FIG. 1. The circuit 600 may include the first transistor 316, the first switch 318, and the buffer 502. The first transistor 316, the first switch 318, and the buffer 502 may operate in a substantially similar manner as described with respect to FIG. 5.

The circuit 600 may also include a first p-type metal oxide semiconductor (PMOS) transistor 616, a first PMOS switch 618, and a second buffer 602. The input signal (IN) may be provided to a gate of the first PMOS transistor 616 via the first capacitor ($C_1$). The gate of the first PMOS transistor 616 may be biased based on the first voltage signal ($V_1$) in a substantially similar manner as the gate of the first transistor 316.

An inverted first control signal ($EN_M'$) may be provided to the second buffer 602. Based on a bit value of the inverted first control signal ($EN_M'$), the second buffer 602 may provide a logical high voltage signal (e.g., a cascoded voltage signal ($V_{CASC}$)) to the gate of the first PMOS switch 618 or a logical low voltage signal (e.g., a ground voltage) to the gate of the first PMOS switch 618. For example, the second buffer 602 may provide the cascoded voltage signal ($V_{CASC}$) to the gate of the first PMOS switch 618 when the bit value of the inverted first control signal ($EN_M'$) is a logical "0." Based on the cascoded voltage signal ($V_{CASC}$), the first PMOS switch 618 may conduct (e.g., current may flow from source to drain) and the branch 610 may be activated. Alternatively, the second buffer 602 may provide the supply voltage (Vdd) to the gate of the first PMOS switch 618 when the bit value of the inverted first control signal ($EN_M'$) is a logical "1." Based on the supply voltage (Vdd), conduction may be disabled and the branch 610 may be deactivated.

The circuit 600 of FIG. 6 may enable the techniques described with respect to FIGS. 3-5 to enable "push-pull" amplifiers. For example, the PMOS transistors 616, 618 (e.g., "push-up" transistors) and NMOS transistors 316, 318 (e.g. "pull-down" transistors) may be implemented within a unit cell (e.g., the branch 610) to operate in a substantially similar manner as the first branch 310 of FIG. 3. Although the circuit 600 of FIG. 6 depicts components of the branch 610, a similar topology may be used to selectively activate other branches of the first amplifier 306 and branches of the second amplifier 308.

Figure 7:
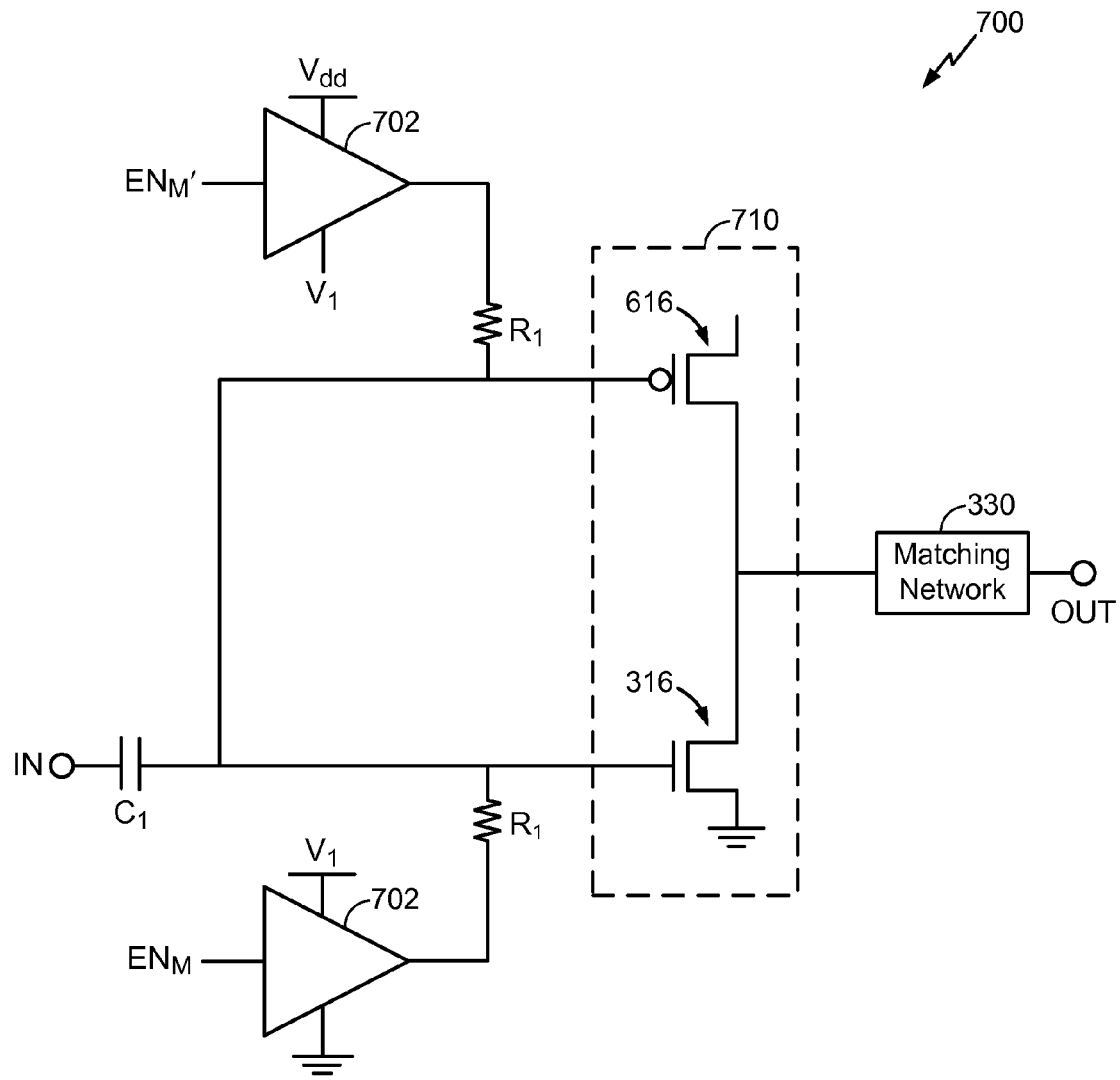
FIG. 7 is a diagram that depicts another exemplary embodiment of a circuit configured to selectively activate a branch based on process variations and temperature variation.

Referring to FIG. 7, another exemplary embodiment of a circuit 700 configured to selectively activate a branch 710 based on process variations and temperature variation is shown. In an exemplary embodiment, the branch 710 may be alternate embodiment of the first branch 310 of FIG. 1. The branch 710 may include the first transistor 316 and the first PMOS transistor 616.

A first bit of the first control signal ($EN_M$) may be provided to a first buffer 702. Based on a bit value of the first bit of the first control signal ($EN_M$), the first buffer 702 may pass the first voltage signal ($V_1$) or a logical low voltage signal (e.g., a ground voltage). The first buffer 702 may pass the first voltage signal ($V_1$) to bias the gate of the first transistor 316 based on the first voltage signal ($V_1$) when the bit value of the first bit is a logical "1." For example, the gate of the first transistor 316 may be biased by the sum of the first voltage signal ($V_1$) and the voltage across the first resistor ($R_1$). Alternatively, the first buffer 702 may pass the ground voltage to bias the gate of the first transistor 316 based on the ground voltage when the bit value of the first bit is a logical "0." Based on the ground voltage, conduction may be disabled and the branch 710 may be deactivated.

A first bit of the first inverted control signal ($EN_M'$) may be provided to a second buffer 704. Based on a bit value of the first bit of the first inverted control signal ($EN_M'$), the second buffer 704 may pass the first voltage signal ($V_1$) or the supply voltage (Vdd). The second buffer 704 may pass the first voltage signal ($V_1$) to bias the gate of the first PMOS transistor 616 based on the first voltage signal ($V_1$) when the bit value of the first bit of the first inverted control signal ($EN_M'$) is a logical "0." For example, the gate of the first PMOS transistor 616 may be biased by the sum of the first voltage signal ($V_1$) and the voltage across the first resistor ($R_1$). Alternatively, the second buffer 704 may pass the supply voltage (Vdd) to bias the gate of the first PMOS transistor 616 based on the supply voltage (Vdd) when the bit value of the first bit of the first inverted control signal ($EN_M'$) is a logical "1." Based on the supply voltage (Vdd), conduction may be disabled and the branch 710 may be deactivated.

The circuit 700 of FIG. 7 may selectively activate the branch 710 without using a cascode topology. For example, the buffers 702, 704 may selectively pass the first voltage signal ($V_1$) to bias the gates of the transistors 316, 616, respectively, based on the first voltage signal ($V_1$). Additionally, the buffers 702, 704 may selectively pass the ground voltage and the supply voltage (Vdd) to the transistors 316, 616, respectively, to deactivate the branch 710.

Figure 8:
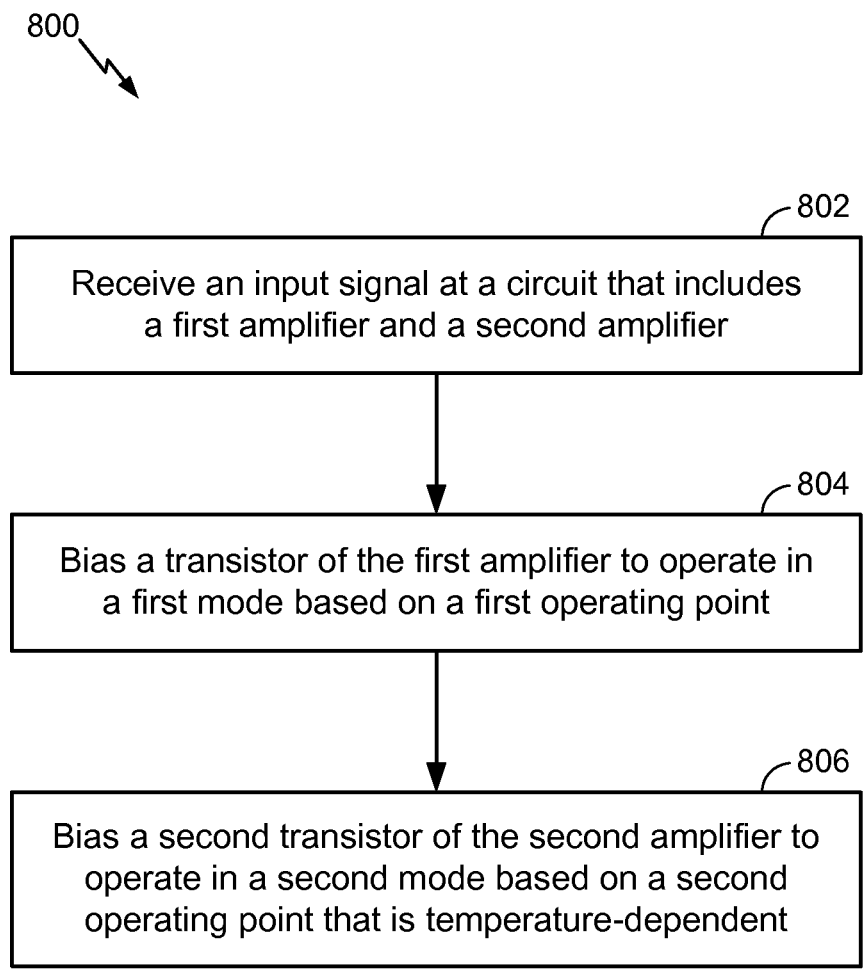
FIG. 8 is a flowchart that illustrates an exemplary embodiment of a method of operating a circuit that includes a first amplifier and a second amplifier.

Referring to FIG. 8, a flowchart that illustrates an exemplary embodiment of a method 800 of operating a circuit that includes a first amplifier and a second amplifier is shown. In an illustrative embodiment, the method 800 may be performed using the wireless device 110 of FIGS. 1-2, the system 300 of FIG. 3, the offset bias generator of FIG. 4, the first embodiment 410 of the circuit to generate the current ($I_0$) of FIG. 4, the second embodiment 420 of the circuit to generate the current ($I_0$) of FIG. 4, the circuit 500 of FIG. 5, the circuit 600 of FIG. 6, the circuit 700 of FIG. 7, or any combination thereof.

The method 800 includes receiving an input signal at a circuit that includes a first amplifier and a second amplifier, at 802. For example, referring to FIG. 3, the input signal (IN) may be provided to the first amplifier 306 via the first capacitor ($C_1$) and to the second amplifier 308 via the second capacitor ($C_2$).

A transistor of the first amplifier may be biased to operate in a first mode based on a first operating point, at 804. For example, referring to FIG. 3, the first transistor 316 may be biased to operate in the first mode based on the first voltage signal ($V_1$). The gate of the first transistor 316 may be biased by the sum of the first voltage of the first voltage signal ($V_1$) and a voltage across the first resistor ($R_1$). The first mode may correspond to a saturation mode (e.g., a strong-inversion mode) of operation. For example, the voltage applied to the gate of the first transistor 316 may be such that the gate voltage of the first transistor 316 is greater than the threshold voltage of the first transistor 316 (e.g., the gate-to-source voltage is greater than the threshold voltage). Biasing the first transistor 316 to operate in the first mode may adjust an amount of current flowing through first branch 310, which may adjust linearity and degradation.

A second transistor of the second amplifier may be biased to operate in a second mode based on a second operating point that is temperature-dependent, at 806. For example, referring to FIG. 3, the offset bias generator 346 may generate the second voltage signal ($V_2$) (e.g., a temperature-dependent voltage signal) and bias the transistors in the branches 320-324 based on the second voltage signal ($V_2$). The second transistor 326 may be biased to operate in the second mode based on the second voltage signal ($V_2$). For example, the gate of the second transistor 326 may be biased at the second voltage of the second voltage signal ($V_2$) through the second resistor ($R_2$). The second mode may correspond to a weak-inversion mode or a sub-threshold operation (e.g., the bias voltage is lower than the threshold voltage to turn on a transistor). For example, the voltage applied to the gate of the second transistor 326 may be such that the gate voltage of the second transistor 326 is less than the threshold voltage of the second transistor 326 (e.g., the gate-to-source voltage is less than the threshold voltage). Biasing the second transistor 326 to operate in the second mode may adjust an amount of current flowing through first branch 320, which may adjust linearity and degradation.

The method 800 of FIG. 8 may enhance linearity (e.g., ACLR) and reduce degradation for multi-gated transistors amplification systems. For example, based on temperature-dependent voltage biasing via the offset bias generator 346, ACLR may be improved approximately between 3.5 decibels (dBs) and 8 dBs for LTE 20 megahertz (MHz) signal across an operational temperature range (e.g., between −30 degrees Celsius and 120 degrees Celsius). Equivalently, power consumption may be reduced by more than 20 percent to achieve a similar linearity performance.

In conjunction with the described embodiments, an apparatus includes means for amplifying a first portion of an input signal. For example, the means for amplifying the first portion of the input signal may include the first amplifier 306 of FIG. 3, the first branch 310 of FIGS. 3 and 6, the second branch 312 of FIG. 3, the $N^{th}$ branch 314 of FIG. 3, the first transistor 316 of FIG. 3, the branch 610 of FIG. 6, the branch 710 of FIG. 7, one or more other devices, circuits, modules, or any combination thereof. The means for amplifying the first portion of the input signal may be biased to operate in a first mode based on a first voltage signal.

The apparatus may also include means for amplifying a second portion of the input signal. The means for amplifying the second portion of the input signal may include the second amplifier 308 of FIG. 3, the first branch 320 of FIG. 3, the second branch 322 of FIG. 3, the $K^{th}$ branch 324 of FIG. 3, the second transistor 326 of FIG. 3, the branch 610 of FIG. 6, the branch 710 of FIG. 7, one or more other devices, circuits, modules, or any combination thereof. The means for amplifying the second portion of the input signal may be biased to operate in a second mode based on a second voltage signal that is temperature-dependent.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a first amplifier comprising a transistor coupled to an input terminal of the first amplifier, the transistor configured to be biased to operate in a first mode;
   a second amplifier coupled in parallel with the first amplifier, the second amplifier comprising a second transistor coupled to an input terminal of the second amplifier, the second transistor configured to be biased based on a temperature to operate in a second mode; and
   biasing and control circuitry coupled to the first amplifier and the second amplifier, the biasing and control circuitry including a temperature sensor and an offset bias generator, the offset bias generator responsive to the temperature sensor and configured to provide a temperature dependent bias voltage to the second transistor.

2. The apparatus of claim 1, wherein the biasing and control circuitry further includes a ratio arbitrator, the ratio arbitrator configured to activate branches of the first amplifier and branches of the second amplifier based on an output of the temperature sensor.

3. The apparatus of claim 2, wherein the biasing and control circuitry further includes a process monitor configured to provide process data related to the first amplifier and the second amplifier, wherein the ratio arbitrator is responsive to the process monitor.

4. The apparatus of claim 1, further comprising a power amplifier, wherein the power amplifier includes the first amplifier and the second amplifier.

5. The apparatus of claim 1, further comprising a driver amplifier, wherein the driver amplifier includes the first amplifier and the second amplifier.

6. The apparatus of claim 1, wherein the first amplifier includes a first plurality of branches.

7. The apparatus of claim 1, wherein the second amplifier includes a second plurality of branches.

8. The apparatus of claim 1, wherein the first mode corresponds to a saturation mode, and wherein the second mode corresponds to a weak-inversion mode.

9. An apparatus comprising:
   first means for amplifying a signal, the first means for amplifying including a first transistor that is configured to be biased to operate in a first mode; and
   second means for amplifying the signal coupled in parallel with the first means for amplifying, the second means for amplifying including a second transistor that is configured to be biased based on a temperature; and
   means for biasing the first transistor and the second transistor, the means for biasing including means for activating branches of the first means for amplifying and branches of the second means for amplifying.

10. The apparatus of claim 9, wherein the means for biasing the first transistor and the second transistor includes means for measuring the temperature.

11. The apparatus of claim 10, wherein the means for biasing the first transistor and the second transistor further includes means for providing a temperature-dependent bias voltage to the second transistor.

12. A method of operating a circuit that includes a first amplifier coupled in parallel with a second amplifier, the method comprising:
   biasing a transistor of the first amplifier to operate in a first mode;
   biasing, based on a temperature, a second transistor of the second amplifier to operate in a second mode;

selectively activating a branch of the first amplifier based on temperature data; and selectively activating a branch of the second amplifier based on the temperature data.

13. The method of claim 12, wherein the biasing the transistor in the first amplifier comprises biasing the transistor in the first amplifier based on a first voltage signal, and wherein the biasing the transistor in the second amplifier comprises biasing the transistor in the second amplifier based on a second voltage signal that is temperature-dependent.

14. The method of claim 12, wherein the first mode corresponds to a saturation mode, and wherein the second mode corresponds to a weak-inversion mode.

* * * * *